United States Patent
Subramania et al.

(10) Patent No.: US 11,085,957 B2
(45) Date of Patent: Aug. 10, 2021

(54) LIGHTNING STRIKE PREDICTION SYSTEM BASED ON RADIO RECEIVER STATIC

(71) Applicant: The Boeing Company, Chicago, IL (US)

(72) Inventors: Halasya Siva Subramania, Karnataka (IN); Balaji Viswanadh, Karnataka (IN); John B. McCormack, Kirkwood, MO (US); Pattada A. Kallappa, Karnataka (IN)

(73) Assignee: The Boeing Company, Chicago, IL (US)

( * ) Notice: Subject to any disclaimer, the term of this patent is extended or adjusted under 35 U.S.C. 154(b) by 382 days.

(21) Appl. No.: 15/672,925

(22) Filed: Aug. 9, 2017

(65) Prior Publication Data
US 2019/0049500 A1 Feb. 14, 2019

(51) Int. Cl.
| | | |
|---|---|---|
| G01R 29/08 | (2006.01) | |
| G01R 31/00 | (2006.01) | |
| G01S 13/95 | (2006.01) | |
| B64D 45/02 | (2006.01) | |
| G01W 1/16 | (2006.01) | |
| G06F 16/00 | (2019.01) | |
| G06F 17/18 | (2006.01) | |

(52) U.S. Cl.
CPC ......... *G01R 29/0842* (2013.01); *B64D 45/02* (2013.01); *G01R 31/008* (2013.01); *G01S 13/953* (2013.01); *G01W 1/16* (2013.01); *G06F 16/00* (2019.01); *G06F 17/18* (2013.01)

(58) Field of Classification Search
CPC .. G01R 29/08; G01R 29/0842; G01R 31/008; G01S 13/95; G01S 13/953; B64D 45/02; G01W 1/16; G06F 16/00; G06F 17/18
See application file for complete search history.

(56) References Cited

U.S. PATENT DOCUMENTS

| | | | |
|---|---|---|---|
| 6,246,367 B1 * | 6/2001 | Markson | ............ G01R 29/0842 |
| | | | 342/460 |
| 7,944,361 B2 | 5/2011 | Anway | |
| 8,410,784 B1 | 4/2013 | Brown et al. | |
| 2007/0088504 A1 * | 4/2007 | Jantunen | ................. G01W 1/10 |
| | | | 702/4 |

* cited by examiner

*Primary Examiner* — Alexander Satanovsky
*Assistant Examiner* — Lynda Dinh
(74) *Attorney, Agent, or Firm* — Vivacqua Crane

(57) ABSTRACT

A system for predicting a triggered lightning strike upon an aircraft, which includes an antenna for collecting an RF signal. The system includes one or more processors and a memory coupled to the processor, the memory storing data into a database and program code that, when executed by the one or more processors, causes the system to receive as input a filtered, amplified form of the RF signal collected by the antenna and a non-filtered, amplified form of the RF signal collected by the antenna. The system determines a difference between the filtered, amplified form of the RF signal and the non-filtered and amplified form of the RF signal. The difference is a static signal. The system determines the triggered lightning strike upon the aircraft based on the static signal.

20 Claims, 4 Drawing Sheets

LIGHTNING STRIKE PREDICTION SYSTEM BASED ON RADIO RECEIVER STATIC

FIELD

The disclosed system and method relates to predicting triggered lightning strikes on an aircraft and, more particularly, to a system that predicts triggered lightning strikes based on radio receiver static obtained by an antenna of the aircraft.

BACKGROUND

It is possible for an aircraft to be struck by lightning while airborne. A triggered lightning strike is created by precipitation static that accumulates upon the surface of the aircraft. The precipitation static, which is commonly referred to as p-static, is created as the aircraft flies through a thunderstorm or by triboelectric charging. Triboelectric charging may be caused by snow, rain or dust particles contacting the frontal surface of the aircraft. Alternatively, the aircraft may intercept the path of lightning that occurs naturally, which is referred to as an intercepted lightning strike.

An intercepted lightning strike occurs without warning. However, a majority of lightning strikes to aircraft are caused by precipitation static that accumulates upon the surface of the aircraft. Various approaches currently exist to measure fields from triggered lightning strike using an electric field sensor. However, no system capable of predicting impending triggered lightning strikes exists.

SUMMARY

The disclosed system provides an approach for predicting triggered lightning strikes upon an aircraft based on radio receiver static using existing antennas and radios of the aircraft. That is, in one embodiment the system does not require additional antennas to be installed upon the aircraft. However, in an alternative approach a dedicated antenna may be provided instead.

In one example, a system for predicting that a triggered lightning strike upon an aircraft is imminent is disclosed. The system includes an antenna for collecting a radio frequency (RF) signal. The system includes one or more processors and a memory coupled to the processor, the memory storing data into a database and program code that, when executed by the one or more processors, causes the system to receive as input a filtered, amplified form of the RF signal collected by the antenna and a non-filtered, amplified form of the RF signal collected by the antenna. The system determines a difference between the filtered, amplified form of the RF signal and the non-filtered and amplified form of the RF signal. The difference is a static signal. The system determines the triggered lightning strike upon the aircraft based on the static signal.

In another example, an aircraft is disclosed that includes a system for predicting that a triggered lightning strike upon an aircraft is imminent. The aircraft comprises an antenna mounted to an exterior of the aircraft, and is for collecting an RF signal. The aircraft also includes one or more processors and a memory coupled to the processor, the memory storing data into a database and program code that, when executed by the one or more processors, causes the system to receive as input a filtered, amplified form of the RF signal collected by the antenna and a non-filtered, amplified form of the RF signal collected by the antenna. The system determines a difference between the filtered, amplified form of the RF signal and the non-filtered and amplified form of the RF signal. The difference is a static signal. The system determines the triggered lightning strike upon the aircraft based on the static signal.

In yet another example, a method for predicting a triggered lightning strike upon an aircraft is disclosed. The method includes collecting an RF signal by an antenna. The method includes receiving, by a computer, a filtered, amplified form of the RF signal collected by the antenna and a non-filtered, amplified form of the RF signal collected by the antenna. The method also includes determining, by the computer, a difference between the filtered, amplified form of the RF signal and the non-filtered and amplified form of the RF signal, wherein the difference is a static signal. Finally, the method includes determining, by the computer, that the triggered lightning strike upon the aircraft is imminent based on the static signal.

Other objects and advantages of the disclosed method and system will be apparent from the following description, the accompanying drawings and the appended claims.

DETAILED DESCRIPTION

Figure 1:
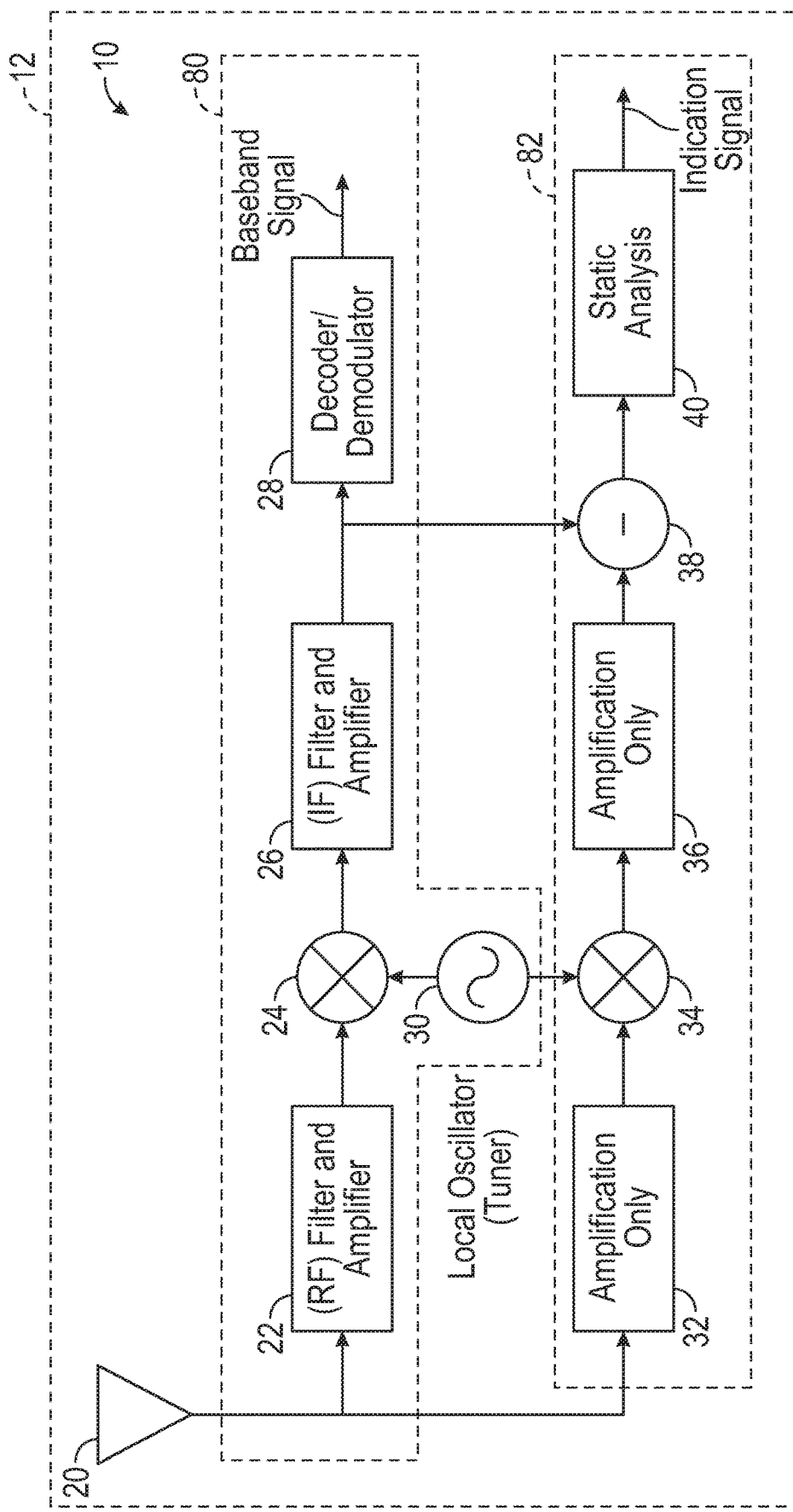
FIG. 1 is an exemplary schematic block diagram of the disclosed system for predicting imminent lightning strikes on an aircraft, where the system includes an antenna, a superheterodyne receiver, a static detector, and a static analysis control module.

FIG. 1 is an exemplary schematic block diagram of the disclosed system 10 for an aircraft 12. The system 10 includes at least one antenna 20, a radio frequency (RF) filter and amplifier 22, a mixer 24, an intermediate frequency (IF) filter and amplifier 26, a decoder/demodulator 28, a local oscillator 30, a first amplifier 32, a mixer 34, a second amplifier 36, a subtract block 38, and a static analysis control module 40. As explained below, the system 10 predicts that a lightning strike upon the aircraft 12 is imminent based on RF signals collected by the antenna 20. In one embodiment, the prediction is made about in about twenty seconds or less.

Figure 2:
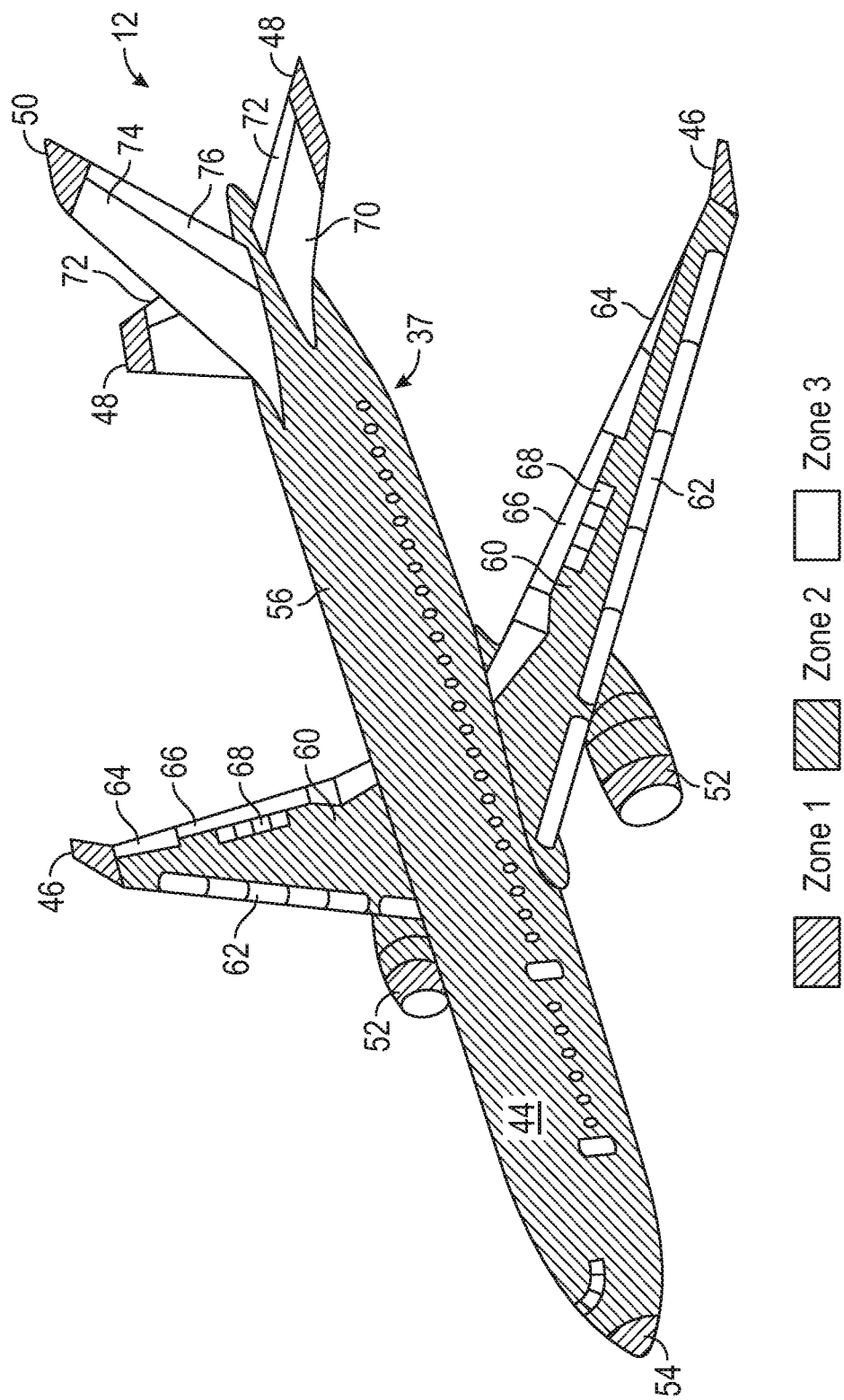
FIG. 2 is illustrates an exterior of the aircraft shown in FIG. 1.

The antenna 20 is mounted to an exterior 37 of the aircraft 12 (FIG. 2). In one embodiment, the antenna 20 represents any existing antenna mounted upon the aircraft 12 used for another application related to the operation of the aircraft 12. Thus, the system 10 does not require a dedicated antenna in order to predict imminent lightning strikes. Instead, the system 10 utilizes an antenna that is already being used for another existing application. In other words, the antenna 20 already exists and is used for at least one other application related to operation of the aircraft 12. However, the antenna 20 does not need to be used for another application. Thus, in another approach the system 10 utilizes a dedicated antenna 20 for collecting the RF signals that are analyzed to determine an imminent lightning strike. Furthermore, although a single antenna 20 is illustrated, multiple antennas may be included as well.

FIG. 2 is a perspective view of the exterior 37 of one embodiment of the aircraft 12. The antenna 20 (only shown in FIG. 1) is located upon or within an exterior surface 44 of the aircraft 12. Referring now to both FIGS. 1 and 2, in one embodiment the antenna 20 is located on a zone 1 region of the aircraft 12. The zone 1 region may include parts of the aircraft 12 such as, but not limited to, wing tips 46, horizontal stabilizer tips 48, vertical stabilizer tip 50, nacelles 52, and a radome 54. However, in another embodiment the antenna 20 is placed in either a zone 2 region or a zone 3 region of the aircraft 12 instead. The zone 2 region of the aircraft 12 includes, but is not limited to, a fuselage 56 and wings 60. The zone 3 region of the aircraft 12 includes, but is not limited to, leading edges 62 of the wings 60, ailerons 64, flaps 66, spoilers 68, a horizontal stabilizer 70, elevators 72, a vertical stabilizer 74, and a rudder 76.

There are two types of lightning strikes that an aircraft experiences, which are triggered and intercepted strikes. An intercepted lightning strike occurs naturally, where an aircraft simply intercepts the path of lightning that occurs naturally. However, a majority of lightning strikes to the aircraft 12 are caused by triggered lightning. Triggered lightning is created by precipitation static that accumulates upon the exterior surface 44 of the aircraft 12. Specifically, the precipitation static may be created as the aircraft 12 flies through a thunderstorm or by triboelectric charging. Triboelectric charging is caused by snow, rain or dust particles contacting the frontal surface of the aircraft 12. Eventually, the precipitation static at the extremities of the aircraft 12, such as the wing tips 46, becomes sufficiently high for corona discharges to occur. The corona discharge indicates build-up of precipitation static upon the aircraft 12, which creates triggered lightning strikes. As explained below, the system 10 analyzes the corona discharges in order to determine patterns that indicate an imminent triggered lightning strike.

In addition to triggering lightning, the corona discharge also causes electromagnetic interference, which is manifested by static in the RF signal collected by the antenna 20. Turning back to FIG. 1, the antenna 20 collects the RF signal. The antenna 20 is in communication with both of the RF filter and amplifier 22 and the amplifier 32. The RF filter and amplifier 22, the mixer 24, the IF filter and amplifier 26, the demodulator 28, and the oscillator 30 are part of a superheterodyne receiver 80. The superheterodyne receiver 80 filters out the static or electromagnetic interference created by the corona discharge. In contrast, the amplifier 32, mixer 34, amplifier 36 and the analysis module 40 create a static detector 82 that does not filter out the static or electromagnetic interference created by the corona discharge, and instead retains both the static and the signal components of the RF signal. However, amplification of the unfiltered signal received by the static detector 82 is performed so that balanced subtraction may occur.

Operation of the superheterodyne receiver 80 and the static detector 82 are explained in detail below. In general, the static detector 82 receives as input a filtered, amplified form of the RF signal collected by the antenna 20 from the superheterodyne receiver 80. The static detector 82 determines a non-filtered, amplified form of the RF signal collected by the antenna 20. Specifically, the first amplifier 32 of the static detector 82 creates an unfiltered amplified signal based on the RF signal collected by the antenna 20. The second amplifier 36 receives a fixed output intermediate frequency signal based on the unfiltered amplified signal. The second amplifier 36 creates the non-filtered, amplified form of the RF signal based on the fixed output intermediate frequency signal. The subtract block 38 of the static detector 82 then determines a difference between the filtered, amplified form of the RF signal and the non-filtered, amplified form of the RF signal, where the difference represents a static signal.

Continuing to refer to FIG. 1, the RF filter and amplifier 22, the mixer 24, and the local oscillator 30 of the superheterodyne receiver 80 handle the RF signal collected from the antenna 20. The RF filter and amplifier 22 receives the RF signal, and the filter portion of the RF filter and amplifier 22 filters the RF to reject an image frequency. After filtering, the RF signal is then amplified by the amplifier portion of the RF filter and amplifier 22. Specifically, the amplifier is tuned to select and amplify a particular carrier frequency within the filtered RF signal to create an amplified RF frequency. Only the particular carrier frequency and two sidebands pass through the amplifier.

The amplified RF frequency is then received as input by the mixer 24. The mixer 24 also receives as input a local frequency of the oscillator 30. The combination of the amplified RF frequency and the local frequency occurs at the mixer 24, and produces a sum frequency and a difference frequency. The sum frequency represents the sum of the amplified RF frequency and the local frequency, and the difference frequency represents the difference between the amplified RF frequency and the local frequency. The difference frequency is referred to as the intermediate frequency. The local oscillator 30 is tuned to a frequency that is either higher or lower than the frequency of the RF signal collected by the antenna 20 by an amount equal to the intermediate frequency.

The sum frequency is rejected by the IF filter and amplifier 26, and the intermediate frequency signal remains. The intermediate frequency signal is a down converted frequency signal, and is amplified by the IF filter and amplifier 26 to create an amplified intermediate frequency signal. The amplified intermediate frequency signal is then sent to the demodulator 28. The demodulator 28 then demodulates the amplified intermediate frequency signal into a baseband signal. In one embodiment, the baseband signal is an analog signal where parameters such as frequency, amplitude, or phase are modulated. Specifically, in one embodiment the baseband signal is a frequency modulated (FM) or an amplitude modulated (AM) signal representing sound. In another embodiment, the baseband represents a binary or digital signal. Although FIG. 1 illustrates the superheterodyne receiver 80 with hardware components, in another embodiment the demodulator 28 is implemented using software.

Operation of the static detector 82 is now explained. In the embodiment as shown, the components of the static detector 82 are illustrated as hardware components. However, in another embodiment the subtract block 38 and the static analysis block 40 are implemented using software. Continuing to refer to FIG. 1, the amplifier 32 also receives the RF signal collected by the antenna 20. The amplifier 32 creates the unfiltered amplified signal based on the RF signal collected by the antenna 20. In other words, the RF signal from the antenna 20 is not filtered, therefore the unfiltered amplified signal includes static or electromagnetic interference created by corona discharge. The mixer 34 receives as input the unfiltered amplified signal from the amplifier 32 and the local frequency signal from the oscillator 30. The mixer 34 combines the unfiltered amplified signal with the local frequency signal of the oscillator 30 to produce the fixed output intermediate frequency signal.

The fixed output intermediate frequency signal is then amplified by the amplifier 36 to create the amplified fixed output intermediate frequency signal. The amplified fixed output intermediate frequency signal is then received by the subtract block 38. The subtract block 38 also receives as input the amplified intermediate frequency signal from the superheterodyne receiver 80. The subtract block 38 determines a difference between the amplified fixed output intermediate frequency signal and the amplified intermediate frequency signal, where the difference represents the static signal. The static signal represents electromagnetic interference that is created by corona discharges. As mentioned above, corona discharges indicate a build-up of precipitation static upon the aircraft 12, which creates triggered lightning strikes. The static signal is then sent to the static analysis control module 40.

Figure 3:
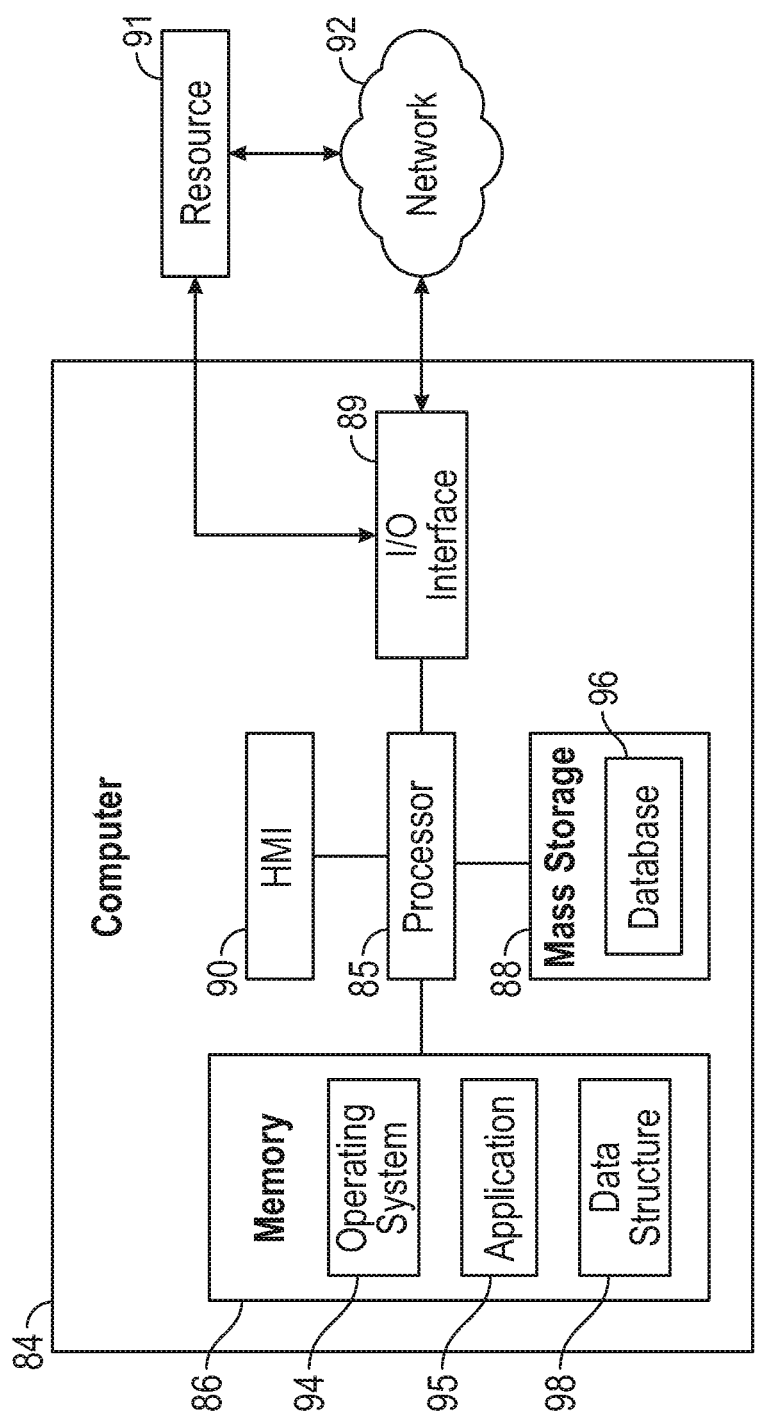
FIG. 3 is a diagrammatic view of an exemplary operating environment for the static analysis control module shown in FIG. 1.

Referring now to FIG. 3, the static analysis control module 40 is implemented on one or more computer devices or systems, such as exemplary computer system 84. The computer system 84 includes a processor 85, a memory 86, a mass storage memory device 88, an input/output (I/O) interface 89, and a Human Machine Interface (HMI) 90. The computer system 84 is operatively coupled to one or more external resources 91 via a network 92 or I/O interface 89. External resources may include, but are not limited to, servers, databases, mass storage devices, peripheral devices, cloud-based network services, or any other suitable computer resource that may be used by the computer system 84.

The processor 85 includes one or more devices selected from microprocessors, micro-controllers, digital signal processors, microcomputers, central processing units, field programmable gate arrays, programmable logic devices, state machines, logic circuits, analog circuits, digital circuits, or any other devices that manipulate signals (analog or digital) based on operational instructions that are stored in the memory 86. Memory 86 includes a single memory device or a plurality of memory devices including, but not limited to, read-only memory (ROM), random access memory (RAM), volatile memory, non-volatile memory, static random access memory (SRAM), dynamic random access memory (DRAM), flash memory, cache memory, or any other device capable of storing information. The mass storage memory device 88 includes data storage devices such as a hard drive, optical drive, tape drive, volatile or non-volatile solid state device, or any other device capable of storing information.

The processor 85 operates under the control of an operating system 94 that resides in memory 86. The operating system 94 manages computer resources so that computer program code embodied as one or more computer software applications, such as an application 95 residing in memory 86, has instructions executed by the processor 85. In an alternative embodiment, the processor 85 executes the application 95 directly, in which case the operating system 94 may be omitted. One or more data structures 98 may also reside in memory 86, and may be used by the processor 85, operating system 94, or application 95 to store or manipulate data.

The I/O interface 89 provides a machine interface that operatively couples the processor 85 to other devices and systems, such as the network 92 or external resource 91. The application 95 thereby works cooperatively with the network 92 or external resource 91 by communicating via the I/O interface 89 to provide the various features, functions, applications, processes, or modules comprising embodiments of the invention. The application 95 has program code that is executed by one or more external resources 91, or otherwise rely on functions or signals provided by other system or network components external to the computer system 84. Indeed, given the nearly endless hardware and software configurations possible, persons having ordinary skill in the art will understand that embodiments of the invention may include applications that are located externally to the computer system 84, distributed among multiple computers or other external resources 91, or provided by computing resources (hardware and software) that are provided as a service over the network 92, such as a cloud computing service.

The HMI 90 is operatively coupled to the processor 85 of computer system 84 in a known manner to allow a user to interact directly with the computer system 84. The HMI 90 may include video or alphanumeric displays, a touch screen, a speaker, and any other suitable audio and visual indicators capable of providing data to the user. The HMI 90 may also include input devices and controls such as an alphanumeric keyboard, a pointing device, keypads, pushbuttons, control knobs, microphones, etc., capable of accepting commands or input from the user and transmitting the entered input to the processor 85.

A database 96 resides on the mass storage memory device 88, and may be used to collect and organize data used by the various systems and modules described herein. The database 96 may include data and supporting data structures that store and organize the data. In particular, the database 96 may be arranged with any database organization or structure including, but not limited to, a relational database, a hierarchical database, a network database, or combinations thereof. A database management system in the form of a computer software application executing as instructions on the processor 85 may be used to access the information or data stored in records of the database 96 in response to a query, where a query may be dynamically determined and executed by the operating system 94, other applications 95, or one or more modules.

Figure 4:
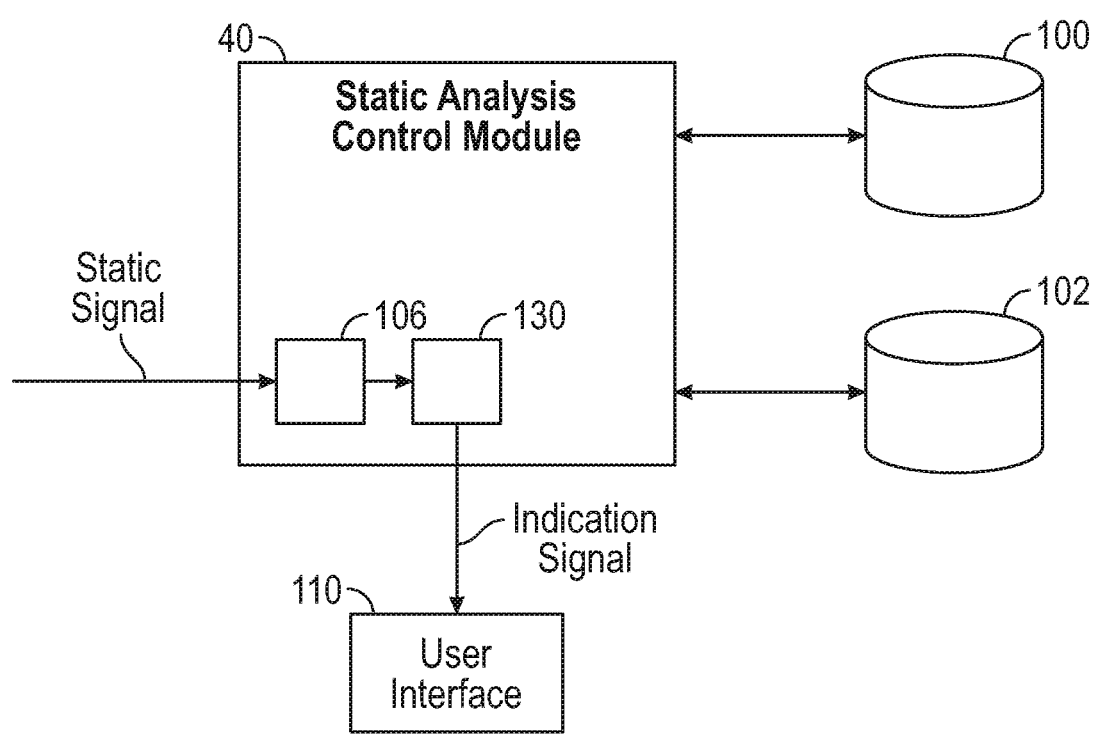
FIG. 4 is a block diagram of the static analysis control module shown in FIG. 1 in communication with a plurality of databases and a user interface.

Turning now to FIG. 4, the static analysis control module 40 is in communication with a static database 100, a lightning strike database 102, and a user interface 110. The static analysis control module 40 includes a correlation submodule 106. The static database 100 stores data indicating a correlation between the static signal received from the subtract block 38 (FIG. 1) and the precipitation static that accumulates upon the exterior surface 44 of the aircraft 12 (FIG. 2). For example, in one embodiment, the static database 100 includes a lookup table. The lookup table correlates the magnitude of the static signal detected by the static detector 82 shown in FIG. 1 with the precipitation static that accumulates on the aircraft 12, to determine an equivalent precipitation static. The equivalent precipitation static is sent to the correlation submodule 106. The lookup table takes into account size, shape and surface material of the specific airplane. Some examples of shape elements include, but are not limited to, nose bluntness, wing sweep, wing or fuselage taper, empennage design, engine location, external stores, sponsors, and other elements defining surfaces exposed to triboelectric charging. Additionally, the location of the antenna or antennas 20 relative to aircraft geometry are considered as well. These parameters will enable selecting the necessary decision criteria for comparing the observed static signature parameters with the likelihood of triggering lightning attachment. The lookup table represents a white-box model where the variables or rules of the model may be viewed or known.

In an alternative embodiment, the correlation submodule 106 of the static analysis control module 40 determines the equivalent precipitation static based on the static signal by a simulation or a model of the aircraft 12. The size, shape elements, and surface material of a specific aircraft, along with the static signal broken down into components such as frequency, amplitude, and width determine the distribution of charges due to triboelectric charging of the specific aircraft. The model may be a white-box model or, alternatively, a black-box model where the variables or rules of the model are not known.

The database 102 stores historical or experimental data indicative of a plurality of operational parameters of the aircraft 12 (FIG. 1). The operational parameters of the aircraft 12 indicate the rate, magnitude, and location of the static signal, any possible instances of triggered lightning strikes that occurred during operation of the aircraft 12, and other characteristics of the aircraft 12. Some examples of other characteristics include, but are not limited to, altitude, ambient temperature, ambient pressure, and aircraft type. In one embodiment, the operational parameters are based on data collected as the aircraft 12 is operating. Alternatively, in another embodiment the experimental data is obtained from laboratory or simulations of the aircraft 12.

Both databases 100, 102 are in communication with a machine learning submodule 130 of the static analysis control module 40. The machine learning submodule 130 receives as input the equivalent precipitation static from the correlation submodule 106. The equivalent precipitation static is representative of a real-time precipitation static signal. As explained above, the equivalent precipitation static is based on the static signal. The machine learning submodule 130 determines if a triggered lightning strike is imminent based on the real-time precipitation static signal and the plurality of operational parameters stored in the database 102. Specifically, the machine learning submodule 130 may determine that a triggered lightning strike is imminent using a variety of approaches. For example, in one embodiment the machine learning submodule 130 determines that a triggered lightning strike is imminent based on the real-time precipitation static signal being equal to or greater than a threshold voltage $V_{th}$. The threshold voltage $V_{th}$ is determined based on the operational parameters. Specifically, the threshold voltage $V_{th}$ is determined empirically based on the operational parameters. The threshold voltage $V_{th}$ is representative of a voltage at which triggered lightning has historically struck the aircraft 12 in the past.

In another embodiment, the machine learning submodule 130 determines a triggered lightning strike is imminent based on analyzing historical behavior of the real-time precipitation static signal when one or more triggered lightning strikes have struck the aircraft 12 in the past. Specifically, the machine learning submodule 130 monitors the real-time signal during operation of the aircraft 12, and in particular during a period of time immediately before the aircraft 12 is struck by a triggered lightning strike. The machine learning submodule 130 analyzes the behavior of the real-time precipitation static signal immediately before the triggered lightning strike. The machine learning submodule 130 determines a plurality probabilistic indicators, which may also be referred to as characteristic properties, of the real-time precipitation static signal immediately before the aircraft 12 is struck by triggered lightning. The probabilistic indicators indicate that a triggered lightning strike is imminent. One example of a probabilistic indicator is a rate of change of static charge affecting the antenna's 20 signal amplitude or frequency. Alternatively, interference observed in the acoustics of radio communications, or other negligible but measurable indicators of static charge build-up may be used instead. In another embodiment, the machine learning submodule 130 may determine a triggered lightning strike is imminent based on the probabilistic indicators in conjunction with the operational parameters of the aircraft 12 such as altitude, ambient temperature, ambient pressure, and aircraft type.

The machine learning submodule 130 may develop data-based models, Kalman filters, matched filters, lookup tables, or any other model that determines the probabilistic indicators of the real-time signal. In one embodiment, the machine learning submodule 130 is a self-learning model that continues to learn and detect patterns in the real-time signal in order to improve the accuracy at which a triggered lightning strike is predicted.

The machine learning submodule 130 generates an indication signal in response to determining that the triggered lightning strike upon the aircraft 12 is imminent. The indication signal is sent to the user interface 110. The user interface 110 generates a visual or audible warning in response to receiving the indication signal. The warning informs a user, such as an airline pilot, that the aircraft 12 is about to be struck by triggered lightning. In one embodiment, the user interface 110 is a screen that displays a warning message in response to receiving the indication signal from the machine learning submodule 130 of the static analysis control module 40. Alternatively, in another embodiment the user interface 110 is a speaker that creates a tone or other sound for warning a triggered lightning strike is imminent.

In one embodiment, a pilot may then change the trajectory of the aircraft 12 if the aircraft 12 is traveling in a direction of continuously increasing corona discharge in response to the user interface 110 indicating a triggered lightning strike is imminent. Additionally or alternatively, the aircraft 12 may react in order to mitigate the effects of an imminent triggered lightning strike. For example, the aircraft 12 electrically isolates certain sensitive electrical systems that are more susceptible to lightning strikes such as, for example, radar navigation system and other systems located in zone 1 of the aircraft 12. In another embodiment, the aircraft 12 diverts the triggered lightning strike towards a sacrificial component of the aircraft 12 such as, for example, a winglet in order to mitigate the effects of the lightning strike.

Referring generally to the figures, the disclosed system detects an imminent triggered lightning strike without the need to mount additional antennas or other hardware upon the exterior of an aircraft. Thus, the disclosed system may result in reduced manufacturing, installation, and maintenance costs when compared to conventional lightning detection systems that are currently available. The disclosed system may also mitigate the effects of lightning strikes upon an aircraft, which also reduce the overall costs of maintaining and repairing various components.

While the forms of apparatus and methods herein described constitute preferred examples of this invention, it is to be understood that the invention is not limited to these precise forms of apparatus and methods, and the changes may be made therein without departing from the scope of the invention.

What is claimed is:
1. A system for predicting that a triggered lightning strike upon an aircraft is imminent, the system comprising:
  an antenna for collecting an RF signal mounted to an exterior surface of the aircraft;

a static database storing data indicating a correlation between a static signal and a precipitation static signal that accumulates upon the exterior surface of the aircraft;

one or more processors; and a memory coupled to the one or more processors, the memory storing data into a database and program code that, when executed by the one or more processors, causes the system to:

receive a filtered and amplified form of the RF signal collected by the antenna, wherein the filtered and amplified form of the RF signal retains a signal component of the RF signal;

receive a non-filtered and amplified form of the RF signal collected by the antenna, wherein the non-filtered and amplified form of the RF signal retains both a static component and the signal component of the RF signal;

determine a difference between the filtered and amplified form of the RF signal and the non-filtered and amplified form of the RF signal, wherein the difference is the static signal; and determine that the triggered lightning strike upon the aircraft is imminent based on the precipitation static signal being equal to or greater than a threshold voltage, wherein the threshold voltage represents a voltage at which lightning has historically struck the aircraft.

2. The system of claim 1, further comprising a database storing data indicative of a plurality of operational parameters of the aircraft, wherein the plurality of operational parameters indicate a rate, a magnitude, and a location of the static signal and instances of triggered lightning strikes that occur during operation of the aircraft.

3. The system of claim 2, wherein the threshold voltage represents a voltage at which lightning has historically struck the aircraft and is determined based on the plurality of operational parameters, and the precipitation static signal is based on the static signal.

4. The system of claim 1, wherein the system determines the triggered lightning strike upon the aircraft is imminent based on analyzing historical behavior of a real-time precipitation static signal when one or more triggered lightning strikes have struck the aircraft in the past, and the real-time precipitation static signal is based on the static signal.

5. The system of claim 1, wherein the system generates an indication signal in response to determining the triggered lightning strike upon the aircraft is imminent.

6. The system of claim 5, further comprising a user interface that generates a visual or audible warning in response to receiving the indication signal.

7. The system of claim 1, further comprising a first amplifier that receives the RF signal collected by the antenna, wherein the first amplifier creates an unfiltered amplified signal based on the RF signal collected by the antenna.

8. The system of claim 7, further comprising a second amplifier that receives a fixed output intermediate frequency signal based on the unfiltered amplified signal.

9. The system of claim 8, wherein the second amplifier creates the non-filtered filtered and amplified form of the RF signal collected by the antenna based on the fixed output intermediate frequency signal.

10. The system of claim 1, wherein the antenna is used for at least one other application related to operation of the aircraft.

11. An aircraft including a system for predicting a triggered lightning strike upon an aircraft is imminent, the system of the aircraft comprising:

an antenna mounted to an exterior surface of the aircraft for collecting an RF signal;

a static database storing data indicating a correlation between a static signal and a precipitation static signal that accumulates upon the exterior surface of the aircraft;

one or more processors; and a memory coupled to the one or more processors, the memory storing data into a database and program code that, when executed by the one or more processors, causes the system to:

receive as input a filtered and amplified form of the RF signal collected by the antenna, wherein the filtered and amplified form of the RF signal retains a signal component of the RF signal;

receive a non-filtered and amplified form of the RF signal collected by the antenna, wherein the non-filtered and amplified form of the RF signal retains both a static component and the signal component of the RF signal;

determine a difference between the filtered and amplified form of the RF signal and the non-filtered and amplified form of the RF signal, wherein the difference is the static signal; and determine that the triggered lightning strike upon the aircraft is imminent based on the precipitation static signal being equal to or greater than a threshold voltage, wherein the threshold voltage represents a voltage at which lightning has historically struck the aircraft.

12. The aircraft of claim 11, wherein the antenna is located on a zone 1 region of the aircraft.

13. The aircraft of claim 11, wherein the antenna is used for at least one other application related to operation of the aircraft.

14. The aircraft of claim 11, further comprising a database storing data indicative of a plurality of operational parameters of the aircraft, wherein the plurality of operational parameters indicate a rate, a magnitude, and a location of the static signal and instances of triggered lightning strikes that occur during operation of the aircraft.

15. A method for predicting a triggered lightning strike upon an aircraft, the method comprising:

collecting an RF signal by an antenna mounted to an exterior surface of the aircraft;

storing data, by a static database, indicating a correlation between a static signal and a precipitation static signal that accumulates upon the exterior surface of the aircraft;

receiving, by a computer, a filtered and amplified form of the RF signal collected by the antenna, wherein a non-filtered and amplified form of the RF signal retains both a signal component of the RF signal;

receiving, by the computer, a non-filtered and amplified form of the RF signal collected by the antenna, wherein the non-filtered and amplified form of the RF signal retains both a static component and the signal component of the RF signal;

determining, by the computer, a difference between the filtered and amplified form of the RF signal and the non-filtered and amplified form of the RF signal, wherein the difference is the static signal; and determining, by the computer, that the triggered lightning strike upon the aircraft is imminent based on the precipitation static signal being equal to or greater than a threshold voltage, wherein the threshold voltage represents a voltage at which lightning has historically struck the aircraft.

16. The method of claim 15, further comprising generating an indication signal in response to determining the triggered lightning strike upon the aircraft is imminent.

17. The method of claim 16, further comprising generating a visual or audible warning by a user interface in response to receiving the indication signal.

18. The method of claim 15, further comprising determining the triggered lightning strike is imminent based on a real-time precipitation static signal being equal to or greater than a threshold voltage.

19. The method of claim 15, wherein the threshold voltage represents a voltage at which lightning has historically struck the aircraft, and the precipitation static signal is based on the static signal.

20. The method of claim 15, further comprising determining the triggered lightning strike is imminent based on analyzing behavior of a real-time precipitation static signal prior to one or more triggered lightning strikes that have historically struck the aircraft in the past, wherein the real-time precipitation static signal is based on the static signal.

\* \* \* \* \*